United States Patent
Gerrish et al.

(10) Patent No.: US 6,961,680 B2
(45) Date of Patent: Nov. 1, 2005

(54) SYNTHESIZED HIGH SPEED DIGITAL FILTERS

(75) Inventors: Kevin S. Gerrish, Corona, CA (US); Aravanan Gurusami, Painted Post, NY (US); David R. Peters, Corning, NY (US)

(73) Assignee: Corning Incorporated, Corning, NY (US)

( * ) Notice: Subject to any disclaimer, the term of this patent is extended or adjusted under 35 U.S.C. 154(b) by 6 days.

(21) Appl. No.: 10/330,711

(22) Filed: Dec. 27, 2002

(65) Prior Publication Data

US 2004/0128113 A1 Jul. 1, 2004

(51) Int. Cl.[7] .................. G06F 15/00; H04B 10/04; G02B 6/28
(52) U.S. Cl. .................. 702/190; 359/333; 385/24; 385/27; 398/130; 398/201
(58) Field of Search .................. 702/17, 69, 70, 702/106, 107, 124, 190; 359/118, 128, 152.09, 333; 385/24, 27; 398/201

(56) References Cited

U.S. PATENT DOCUMENTS

| | | | |
|---|---|---|---|
| 4,784,453 A | 11/1988 | Shaw et al. .................. 385/24 |
| 4,993,797 A | 2/1991 | Groves-Kirby et al. ....... 385/30 |
| 5,594,576 A | * 1/1997 | Sutherland et al. ........... 398/58 |
| 5,943,457 A | * 8/1999 | Hayward et al. ............. 385/24 |
| 6,067,180 A | * 5/2000 | Roberts ...................... 398/201 |
| 6,483,621 B1 | * 11/2002 | Adams et al. .............. 398/130 |
| 2003/0133650 A1 | * 7/2003 | Hakimi et al. ................ 385/27 |
| 2004/0001248 A1 | * 1/2004 | Grubb et al. ............... 359/333 |

OTHER PUBLICATIONS

R.E. Ziemer et al "Signals and Systems: Continuous and Discrete", Macmillan Publishing Company, New York, NY (second edition), pp. 323–367 and 375–381, 1989.

J.G Proakis et al. "Introduction to Digital Signal Processing", Macmillan Publishing Company, New York, NY, pp. 148–211 and 469–505, 1988.

M.E. Van Valkenburg "Analog Filter Design", Saunders College Publishing, USA, pp. 279–299 and 587–599, 1982.

* cited by examiner

*Primary Examiner*—Bryan Bui
*Assistant Examiner*—John Le

(57) ABSTRACT

A synthesized digital filter and method for synthesizing the digital filter are described herein. In one embodiment of the present invention, the digital filter is made using analog RF components. In another embodiment of the present invention, the digital filter is made using optical components which enables an optical signal to be manipulated in an optical domain without needing to convert the optical signal into an electrical domain.

21 Claims, 4 Drawing Sheets

SYNTHESIZED HIGH SPEED DIGITAL FILTERS

BACKGROUND OF THE INVENTION

1. Field of the Invention

The present invention relates to a synthesized digital filter made from analog components or optical components.

2. Description of Related Art

The basic function of digital filters is to manipulate a sampled set of data and produce a new sampled set of data. The digital filter can manipulate data using convolution techniques if the processing is restrained to the time domain. Or, the digital filter can manipulate data using Z-transform techniques if the processing is restrained to the frequency domain. Regardless of how the data is manipulated, all digital filters are implemented as either a Finite Impulse Response (FIR) Filter or an Infinite Impulse Response (IIR) Filter. The issue of which type of digital filter should be used for a particular design depends upon the nature of the problem and the specification of the desired response.

A digital filter 100 can be based on the following well known difference equation #1:

$$y(n \cdot T) = \sum_{i=0}^{r} L_i \cdot x(n \cdot T - i \cdot T) - \sum_{j=1}^{m} K_j \cdot y(n \cdot T - j \cdot T) \quad (1)$$

where:
- T=Sampling period.
- n=An integer to establish the time position of each sample.
- x(nT)=Discretized or sampled value of input signal (102).
- y(nT)=Discretized or sampled value of output signal (104).
- r=The number of input sample coefficients.
- m=The number of output sample coefficients.
- $L_i$=Gain (tap weights) for the input sample data (106).
- $K_j$=Gain (tap weights) for the output sample data (108).

FIG. 1 is a block diagram illustrating a graphical representation of an IIR digital filter 100 based on equation #1. It is understood that if m is set equal to zero, then the digital filter is a FIR digital filter because the computed output y(n) is dependent on the current input sample x(n) and past input samples x(n−i). If m is not zero, then the digital filter is an IIR filter because the computed output y(n) is dependent upon the last computed output y(n−j), as well as the current input sample x(n) and past samples x(n−i).

A digital filter 200 can also be based on the following well known difference equation #2 which is created by applying a z-transform to equation #1:

$$H(z) = \frac{Y(z)}{X(z)} = \frac{\sum_{i=0}^{r} L_i \cdot z^{-i}}{1 + \sum_{j=1}^{m} K_j \cdot z^{-j}} \quad (2)$$

where:
- H(z)=Z-transform of filter response.
- Y(z)=Z-transform of output response (212).
- X(z)=Z-transform of input response (202).
- r=The number of input sample coefficients.
- m=The number of output sample coefficients.
- $L_i$=Gain (tap weights) for the input sample data (206).
- $K_j$=Gain (tap weights) for the output sample data (208).
- $z^{-i}$=Z-transform of the discretized version of an input delayed by i samples (204).
- $z^{-j}$=Z-transform of the discretized version of an output delayed by j samples (210).

FIG. 2 is a block diagram illustrating a direct graphical representation of an IIR digital filter 200 based on equation #2. As can be appreciated, the direct graphical representation of the IIR digital filter 200 based on equation #2 avoids the complicated inverse z-transform associated with the IIR digital filter 100 based on equation #1. As can also be appreciated, the direct graphical representation of the IIR digital filter 200 requires the use of a relatively large number of r+m unit delays shown as $z^{-1}$ elements 204 and 210. The requirement of using a relatively large number of $z^{-1}$ unit delay elements 204 and 210 can be significantly reduced in many applications by re-arranging various elements and moving the $z^{-1}$ unit delay elements 204 to produce yet another graphical representation of the IIR digital filter 200. A second graphical representation of an IIR digital filter 300 based on equation #2 is shown in FIG. 3. Even though the IIR digital filter 300 is shown with the assumption that m is larger than r in equation #2, it could be easily drawn for the case where r is larger than m.

The traditional way to implement either of the topologies associated with IIR digital filter 100, 200 and 300 is to use at least three digital components including: (1) a signal processing unit (SPU); (2) an analog-to-digital (A/D) converter; and (3) a digital-to-analog (D/A) converter. It is well known that the operating speeds of these digital components directly relate to and limit the operating speed of the IIR digital filter 100, 200 and 300. Unfortunately, as the operating speeds of these digital components increase so does their size, cost and power dissipation. Accordingly, there is a need for a digital filter that is implemented with non-digital components which enables a break through the speed barrier and also lowers the cost, size and power dissipation associated with the digital components used to implement the traditional digital filter. This need and other needs are satisfied by the synthesized digital filter of the present invention.

BRIEF DESCRIPTION OF THE INVENTION

The present invention includes a synthesized digital filter and method for synthesizing the digital filter. In one embodiment of the present invention, the digital filter is made using analog RF components. In another embodiment of the present invention, the digital filter is made using optical components which enables an optical signal to be manipulated in an optical domain without needing to convert the optical signal into an electrical domain.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE DRAWINGS

Figure 4:
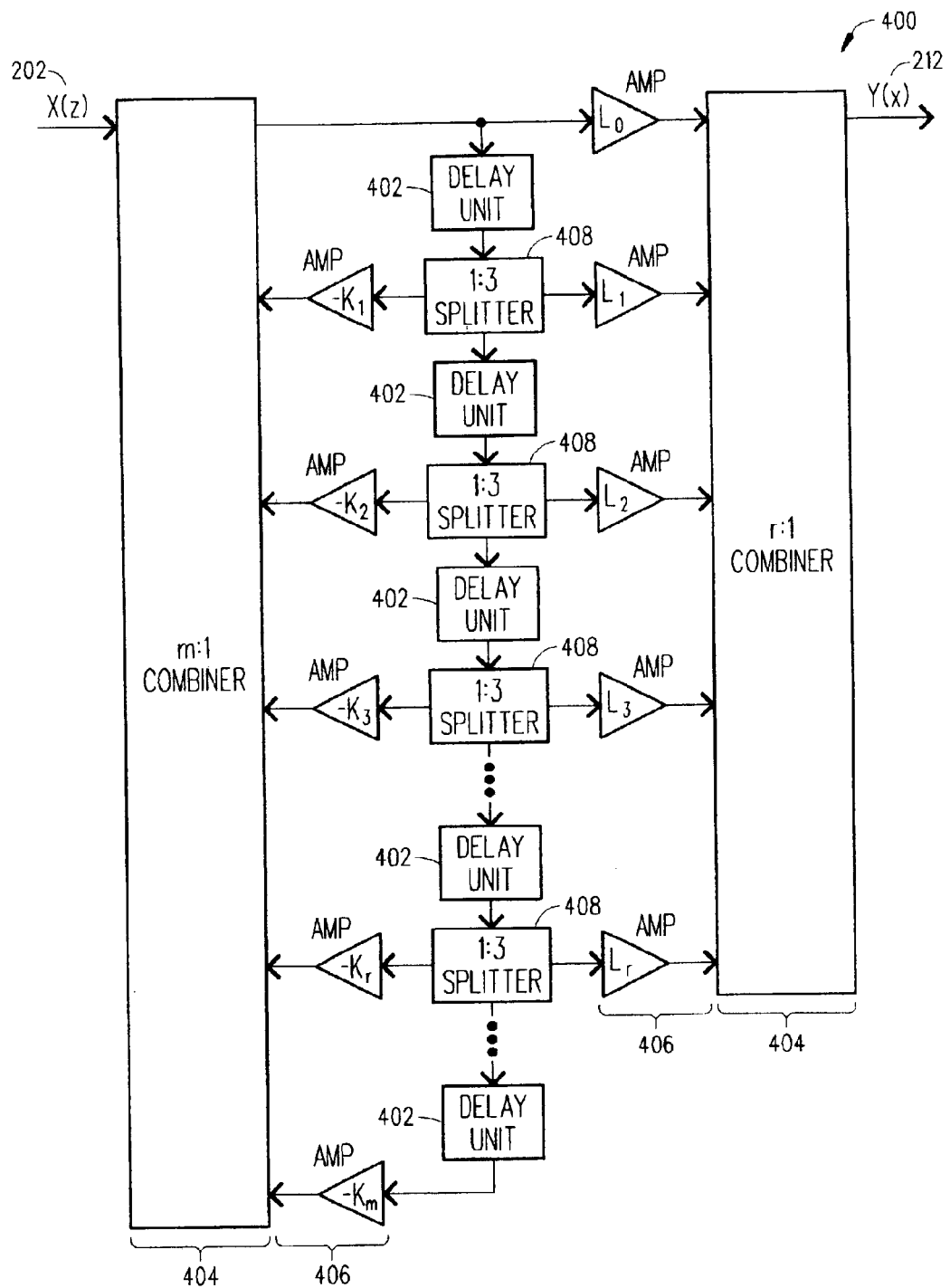
FIG. 4 is a block diagram of an IIR digital filter that has an analog RF topology in accordance with a first embodiment of the present invention.
Figure 5:
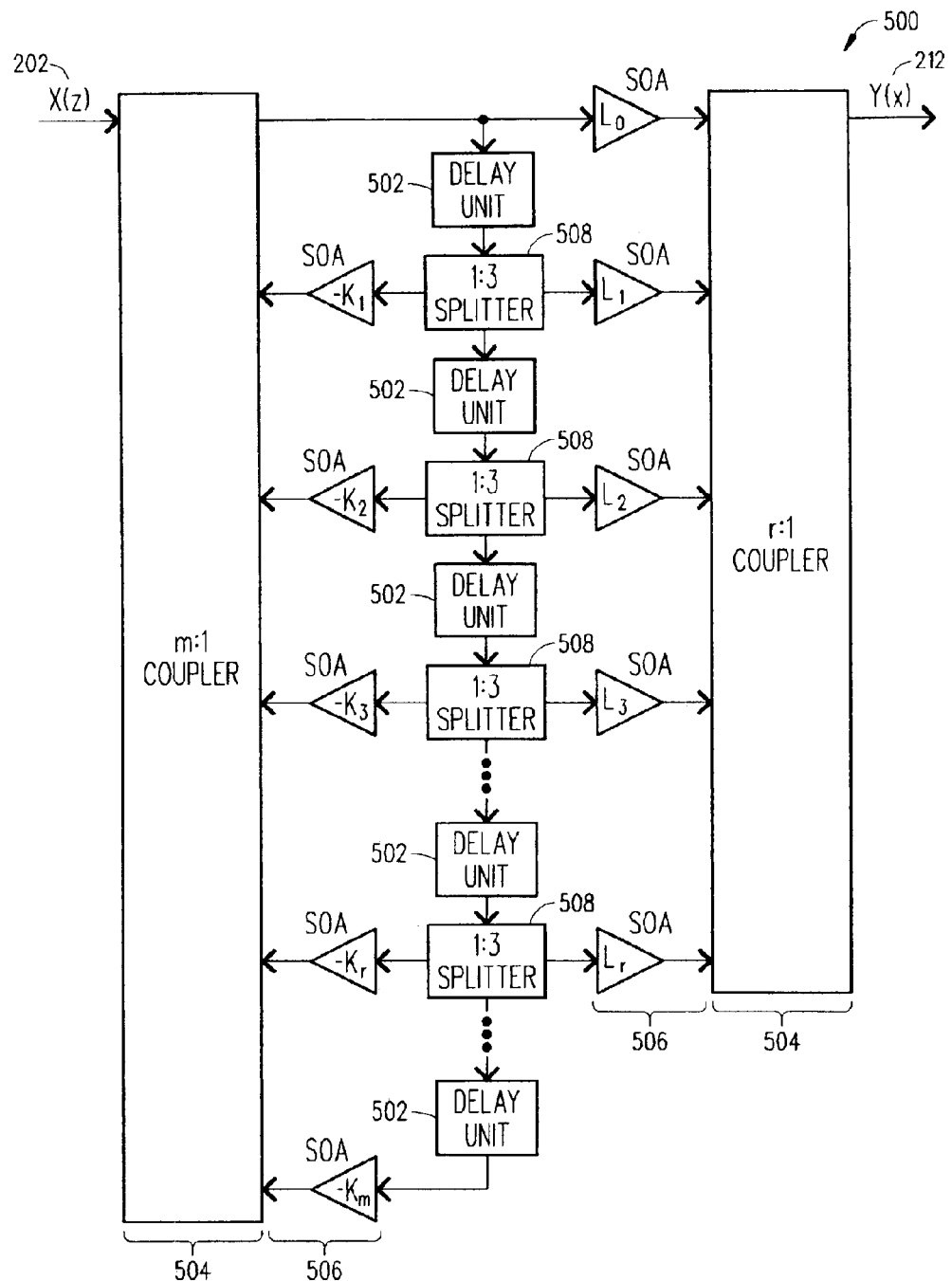
FIG. 5 is a block diagram of an IIR digital filter that has an all-optical topology in accordance with a second embodiment of the present invention.

Referring to FIGS. 4–5, there are disclosed two embodiments of a digital filter 400 and 500 in accordance with the present invention. Although the digital filters 400 and 500 are described herein as being IIR digital filters, it should be understood that the digital filters 400 and 500 could also be FIR digital filters. Accordingly, the digital filters 400 and 500 of the present invention should not be construed in a limited manner.

The digital filters 400 and 500 are synthesized by using the digital signal processing difference equation #2 and a direct mapping approach in which non-digital components replace the digital components including the SPU, the D/A converter and the A/D converter that are needed implement the traditional digital filters 100, 200 and 300. Two embodiments of the IIR digital filters 400 and 500 and how these IIR digital filters 400 and 500 are synthesized using non-digital components are described below with respect to FIGS. 4 and 5.

Figure 3:
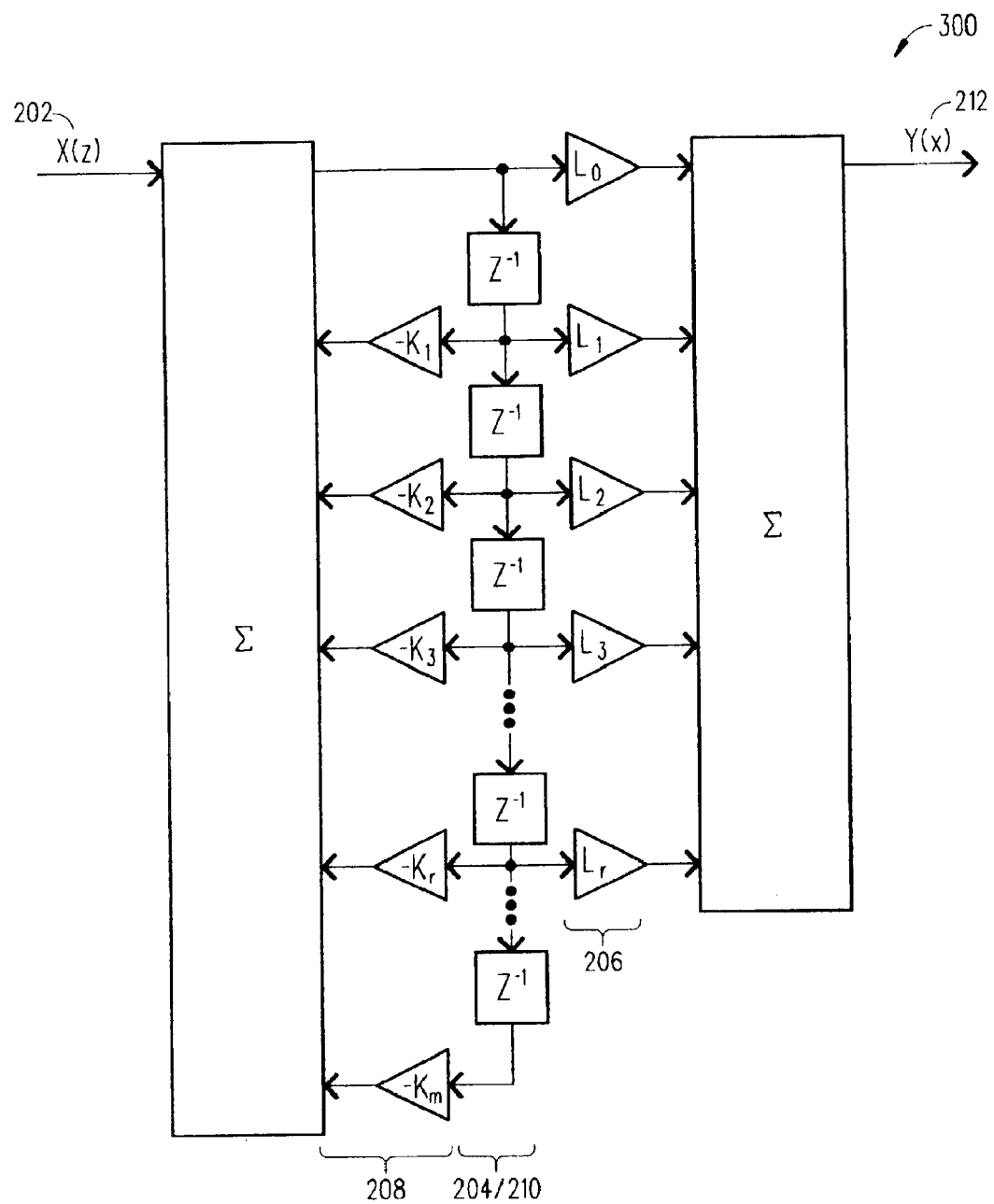
FIG. 3 (PRIOR ART) is a block diagram illustrating another graphical representation of the IIR digital filter based on equation #2.

Referring to FIG. 4, there is a block diagram illustrating the IIR digital filter 400 that has an analog RF topology in accordance with the first embodiment of the present invention. To synthesize the IIR digital filter 400, each of the elements 204, 206, 208 and 210 associated with the traditional IIR digital filter 300 shown in FIG. 3 are replaced with analog components. As such, the IIR digital filter 400 has an analog topology and digital components including a SPU, D/A converters, and A/D converters are not required to implement the IIR digital filter 400.

In the preferred embodiment, the IIR digital filter 400 synthesizes the following digital signal processing difference equation #3:

$$H(z) = \frac{Y(z)}{X(z)} = \frac{\sum_{i=0}^{r} L_i \cdot z^{-i}}{1 + \sum_{j=1}^{m} K_j \cdot z^{-j}} \quad (3)^*$$

where:

$H(z)$=Z-transform of filter response.
$Y(z)$=Z-transform of output response.
$X(z)$=Z-transform of input response.
r=Number of input sample coefficients.
m=Number of output sample coefficients.
$L_i$=Gain (tap weights) for the input sample data (206).
$K_j$=Gain (tap weights) for the output sample data (208).
$z^{-i}$=Z-transform of the discretized version of an input delayed by i samples (204).
$z^{-j}$=Z-transform of the discretized version of an output delayed by j samples (210).

The IIR digital filter 400 is synthesized by replacing each element 204, 206, 208 and 210 of equation #3 with an analog component as follows:

Each memory element $z^{-i}$ 204 and $z^{-j}$ 210 is replaced with a delay unit 402 that delays a presented voltage for a predetermined amount of time. The voltage at the end of this delay unit 402 is a "memory" of the voltage at the beginning of the delay unit 402. The longer the delay unit 402, the longer the delay and the longer the sample period. The delay unit 402 can be as simple as a length of cable or as complicated as a filter designed to fit an idealized Bessel-Thomsom polynomial.

Each sum block Σ is replaced with an analog power combiner 404.

Each gain block element $L_i$ 206 and $K_j$ 208 is replaced with an analog amplifier 406. Or, each gain block element $L_i$ 206 and $K_j$ 208 can be synthesized using a simple resistor divider network or an attenuator if the gain is scaled to a value less than one.

Each T-junction between each pair of delay units 402 is replaced with an analog power splitter 408.

Figure 1:
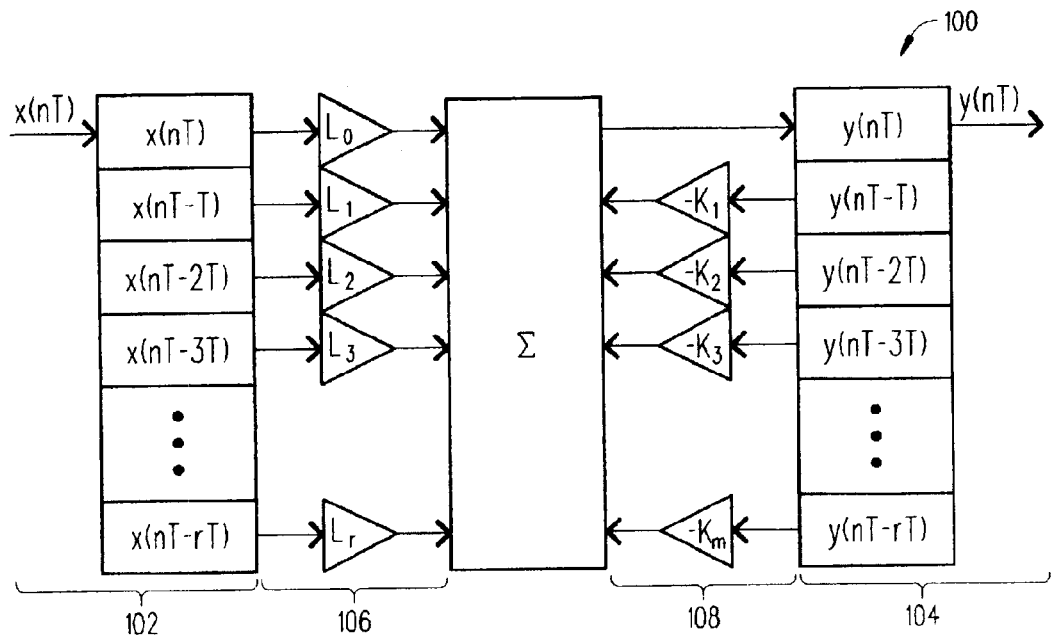
FIG. 1 (PRIOR ART) is a block diagram illustrating a graphical representation of an IIR digital filter based on equation #1.
Figure 2:
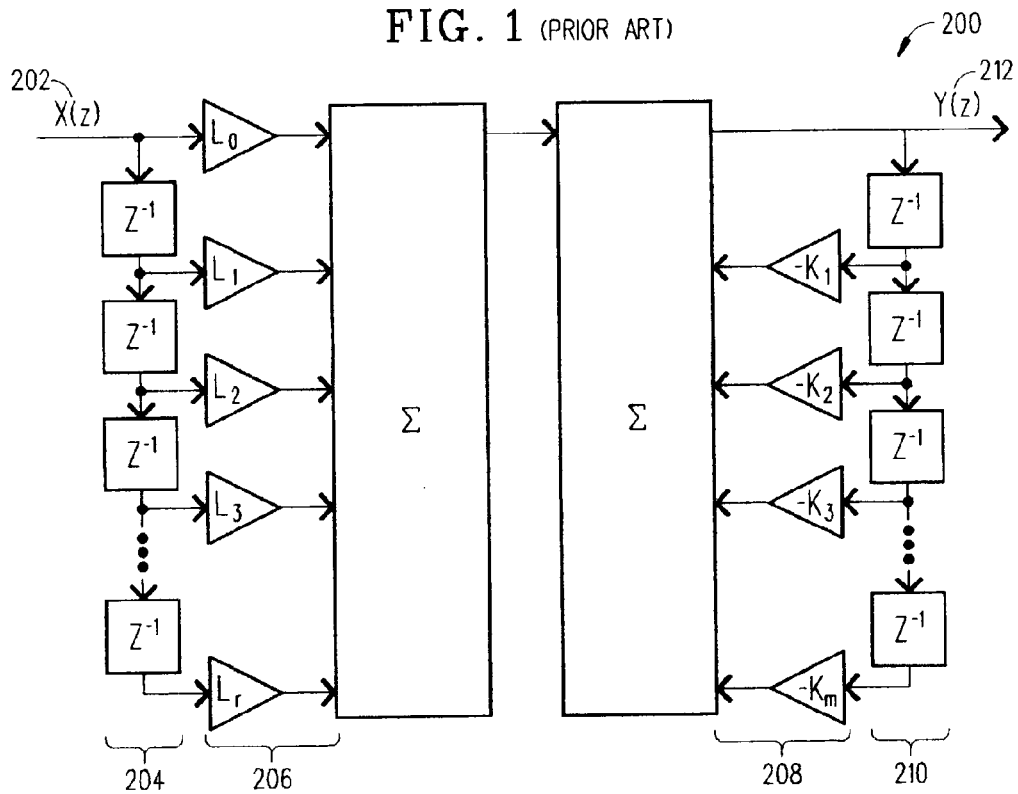
FIG. 2 (PRIOR ART) is a block diagram illustrating a graphical representation of the IIR digital filter based on equation #2.

It should be understood that the elements 402, 406 and 408 shown in FIG. 4 can be re-arranged to form other architectures of an IIR digital filter which are considered to be within the scope of the present invention (see, e.g., FIG. 2). It should also be understood that if m is set equal to zero then the IIR digital filter 400 takes the form of a FIR digital filter. The FIR digital filter would look just like the IIR digital filter 400 except that the gain elements $L_i$ are removed and the gain element $L_0$ is set to 1.

In this embodiment, the signal processing speed of the IIR digital filter 400 is no longer limited by the speed of the SPU, the A/D converter and the D/A converter as in the past but is instead limited by the bandwidths of the analog amplifiers 406 and the analog power combiners 404. For example, the IIR digital filter 400 can process an optical signal that has a sample rate in the range of 1 GHz which is not possible using the traditional digital filters 100, 200 and 300.

The IIR digital filter 400 has several drawbacks associated with processing a signal using analog components 402, 404, 406 and 408. First, it is an engineering challenge to balance the extra delays introduced by the analog combiners 404, the analog amplifiers 406, the analog power splitters 408 and to manage the loss budgets introduced by these non-ideal elements. However, the techniques to address these challenges are straightforward. Secondly, the IIR digital filter 400 having the analog RF topology and the analog components 402, 404, 406 and 408 can be expensive to manufacture. Thirdly, the IIR digital filter 400 has a smaller dynamic range when compared to the traditional digital filters 100, 200 and 300. Finally, to conduct any type of high-speed signal processing of optical signals using the IIR digital filter 400, a high-speed photo diode (not shown) is required to turn the modulated optical signals into modulated electrical signals 202. The cost of the high-speed photo diode increases exponentially as signal processing speed increases. This cost problem gets amplified by the extra cost of LASERs, modulators, and their supporting circuitry if the output of the IIR digital filter 400 is needed to drive another optical layer. To address the drawbacks associated with the first embodiment of the IIR digital filter 400, the inventors have developed the second embodiment of the IIR digital filter 500 which uses optical components that enable an optical signal to be manipulated in an optical domain without needing to convert the optical signal into an electrical domain.

Referring to FIG. 5, there is a block diagram of the IIR digital filter 500 that has an all-optical topology in accordance with the second embodiment of the present invention.

To synthesize the IIR digital filter 500, each of the elements 204, 206, 208 and 210 associated with the traditional IIR digital filter 300 shown in FIG. 3 are replaced with optical elements. As such, the IIR digital filter 500 has an all-optical topology and digital components including an SPU, D/A converters, and A/D converters are not required to implement the IIR digital filter 500.

In the preferred embodiment, the IIR digital filter 500 synthesizes the following digital signal processing difference equation #4:

$$H(z) = \frac{Y(z)}{X(z)} = \frac{\sum_{i=0}^{r} L_i \cdot z^{-i}}{1 + \sum_{j=1}^{m} K_j \cdot z^{-j}} \quad (4)^*$$

where:
- H(z)=Z-transform of filter response.
- Y(z)=Z-transform of output response.
- X(z)=Z-transform of input response.
- r=Number of input sample coefficients.
- m=Number of output sample coefficients.
- $L_i$=Gain (tap weights) for the input sample data (206).
- $K_j$=Gain (tap weights) for the output sample data (208).
- $z^{-i}$=Z-transform of the discretized version of an input delayed by i samples (204).
- $z^{-j}$=Z-transform of the discretized version of an output delayed by j samples (210).

The IIR digital filter is synthesized by replacing each element 204, 206, 208 and 210 of equation #4 with an optical component as follows:

Each memory elements $z^{-i}$ 204 and $z^{-j}$ 210 is replaced with a delay unit 502. The delay unit 502 can be a device as simple as a piece of fiber.

Each sum block Σ is replaced with a combiner 504. The combiner 504 can be a device as complicated as an interferometer or as simple as a tap.

Each gain block element $L_i$ 206 and $K_j$ 208 are replaced with an amplifier 506. The amplifier 506 can be, for example, a semiconductor optical amplifier (SOA), an electro-absorptive modulator (EAM) or an erbium-doped fiber amplifier (EDFA). The amplifiers 506 are chosen so as to be fast enough to enable the desired processing rate of the IIR digital filter 500. Alternatively, each gain block element $L_i$ 206 and $K_j$ 208 can be replaced with an attenuator (e.g., VOA, optical attenuator) if the gain is scaled to a value less than one.

Each T-junction between each pair of delay units 502 is replaced with a splitter 508. The splitter 508 can be a device as complicated as an interferometer or as simple as a tap.

It should be understood that the elements 502, 504, 506 and 508 shown in FIG. 5 can be re-arranged to form other architectures of an IIR digital filter which are considered to be within the scope of the present invention (see, e.g., FIG. 2). It should also be understood that if m is set equal to zero then the IIR digital filter 500 takes the form of a FIR digital filter. The FIR digital filter would look just like the IIR digital filter 500 except that the gain elements $L_i$ are removed and the gain element $L_0$ is set to 1.

Although the IIR digital filter 500 is shown being made with bulk optical components 502, 504, 506 and 508, it can also be made by incorporating the optical components 502, 504, 506 and 508 onto a Lightwave Optical Circuit (LOC). In fact, the LOC version of the IIR digital filter 500 has several advantages over the IIR digital filter 500 that is made from bulk optical components 504, 506 and 508. Some of these advantages include: (1) lower cost; (2) smaller size; (3) increased density; (4) improved reliability; and (5) improved repeatability. Moreover, the LOC version of the IIR digital filter 500 can easily accommodate dynamically adjustable sample rates within it's signal processing engine by allowing for a method to change the index of refraction and hence the speed of light in the delay units 502. One way to change the index of refraction of a specific delay unit 502 (e.g., fiber 502) is to change the temperature of that delay unit 502. Another way to change the index of refraction of a delay unit 502 is to use a delay unit 502 that can change it's index when an external electrical field is applied to it by for example a crystal in a LCD. Yet another way to change the index of refraction of a delay unit 502 is to use one which is an acoustic-optic material that is sensitive to sound waves. Still yet another way to the change the index of refraction of a delay unit 502 is to use one which is a stack of very thin optically transparent films that can be stretched or compressed.

The IIR digital filter 500 also has the advantage of not having the bandwidth-limiting problem associated with the IIR digital filter 400. As such, the IIR digital filter 500 is capable of even higher processing speeds when compared to the IIR digital filter 400 and the conventional IIR digital filters 100, 200 and 300. For example, the IIR digital filter 500 can process an optical signal that has a sample rate in the range of 500 GHz.

From the foregoing, it can be readily appreciated by those skilled in the art that the present invention includes a method for using RF analog components or optical components to synthesize FIR/IIR difference equations and manipulate the gain coefficients in FIR/IIR difference equations in order to make digital filters such as the IIR digital filters 400 and 500.

Although several embodiments of the present invention has been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A digital filter comprising a device that synthesizes a digital signal processing difference equation:

$$H(z) = \frac{Y(z)}{X(z)} = \frac{\sum_{i=0}^{r} L_i \cdot z^{-i}}{1 + \sum_{j=1}^{m} K_j \cdot z^{-j}}$$

where:
- H(z)=Z-transform of filter response
- Y(z)=Z-transform of output response
- X(z)=Z-trans form of input response
- r=Number of input sample coefficients
- m=Number of output sample coefficients
- $L_i$=Gain (tap weights) for the input sample data
- $K_j$=Gain (tap weights) for the output sample data
- $z^{-i}$=Z-transform of the discretized version of an input delayed by i samples
- $z^{-j}$=Z-transform of the discretized version of an output delayed by j samples said digital filter is synthesized by replacing elements of said digital signal processing difference equation with an optical component as follows:

each memory element $z^{-i}$ and $z^{-j}$ is replaced with a delay unit;

each sum block $\Sigma$ is replaced with a combiner;

each gain block element $L_i$ and $K_j$ is replaced with an amplifier or an attenuator; and each T-junction between each pair of delay units is replaced with a splitter.

2. The digital filter of claim 1, wherein each delay unit is a piece of optical fiber.

3. The digital filter of claim 1, wherein each combiner is a tap or an interferometer.

4. The digital filter of claim 1, wherein each splitter is a tap or an interferometer.

5. The digital filter of claim 1, wherein:

each amplifier is an semiconductor optical amplifier, an electro-absorptive modulator or an erbium-doped fiber amplifier; and each attenuator is an optical attenuator if the gain is scaled to a value less than one.

6. The digital filter of claim 1, wherein said digital filter is an infinite impulse response filter.

7. The digital filter of claim 1, wherein said digital filter is a finite impulse response filter when m is set to zero.

8. The digital filter of claim 1, wherein said optical components are incorporated onto a lightwave optical circuit.

9. The digital filter of claim 1, wherein said digital filter manipulates an optical signal that has a sample rate less than or equal to 500 GHz.

10. The digital filter of claim 1, wherein said digital filter manipulates an optical signal that has a dynamic sample rate.

11. A method comprising step of synthesizing a digital filter that implements a digital signal processing difference equation:

$$H(z) = \frac{Y(z)}{X(z)} = \frac{\sum_{i=0}^{r} L_i \cdot z^{-i}}{1 + \sum_{j=1}^{m} K_j \cdot z^{-j}}$$

where:

H(z)=Z-transform of filter response

Y(z)=Z-trans form of output response

X(z)=Z-trans form of input response r=Number of input sample coefficients m=Number of output sample coefficients $L_i$=Gain (tap weights) for the input sample data $K_j$=Gain (tap weights) for the output sample data $z^{-i}$=Z-transform of the discretized version of an input delayed by i samples $z^{-j}$=Z-transform of the discretized version of an output delayed by j samples said digital filter is synthesized by replacing elements of said digital signal processing difference equation with an optical component in accordance with the following steps:

replacing each memory element $z^{-i}$ and $z^{-j}$ with a delay unit;

replacing each sum block $\Sigma$ with a combiner;

replacing each gain block element $L_i$ and $K_j$ with an amplifier or an attenuator; and replacing each T-junction between each pair of delay units with a splitter.

12. The method of claim 11, wherein:

each delay unit is a piece of optical fiber;

each combiner is a tap or an interferometer;

each splitter is a tap or an interferometer;

each amplifier is a semiconductor optical amplifier, an electro-absorptive modulator or an erbium doped fiber amplifier; and each attenuator is an optical attenuator if the gain is scaled to a value less than one.

13. The method of claim 11, wherein said optical components are incorporated onto a lightwave optical circuit.

14. A digital filter comprising a device that synthesizes a digital signal processing difference equation:

$$H(z) = \frac{Y(z)}{X(z)} = \frac{\sum_{i=0}^{r} L_i \cdot z^{-i}}{1 + \sum_{j=1}^{m} K_j \cdot z^{-j}}$$

where:

H(z)=Z-transform of filter response

Y(z)=Z-transform of output response

X(z)=Z-transform of input response r=Number of input sample coefficients m=Number of output sample coefficients $L_i$ =Gain (tap weights) for the input sample data $K_j$=Gain (tap weights) for the output sample data $z^{-i}$=Z-transform of the discretized version of an input delayed by i samples $z^{-j}$=Z-transform of the discretized version of an output delayed by j samples said digital filter is synthesized by replacing elements of said digital signal processing difference equation with an analog component as follows:

each memory element $z^{-i}$ and $z^{-j}$ is replaced with a delay unit that delays a presented voltage for a predetermined amount of time;

each sum block $\Sigma$ is replaced with an analog power combiner;

each gain block element $L_i$ and $K_j$ is replaced with an analog amplifier, a resistor divider network or an attenuator; and each T-junction between each pair of delay units is replaced with an analog power splitter.

15. The digital filter of claim 14, wherein each delay unit that delays a presented voltage for a predetermined amount of time is a length of cable or a filter.

16. The digital filter of claim 14, wherein said digital filter is an infinite impulse response filter.

17. The digital filter of claim 14, wherein said digital filter is a finite impulse response filter when m is set to zero.

18. The digital filter of claim 14, wherein said digital filter manipulates an optical signal that has a sample rate in the range of 1 GHz.

19. A method comprising step of synthesizing a digital filter that implements a digital signal processing difference equation as follows:

$$H(z) = \frac{Y(z)}{X(z)} = \frac{\sum_{i=0}^{r} L_i \cdot z^{-i}}{1 + \sum_{j=1}^{m} K_j \cdot z^{-j}}$$

where:

H(z)=Z-trans form of filter response

Y(z)=Z-transform of output response

X(z)=Z-transform of input response r=Number of input sample coefficients m=Number of output sample coefficients $L_i$=Gain (tap weights) for the input sample data $K_j$=Gain (tap weights) for the output sample data $z^{-i}$=Z-transform of the discretized version of an input delayed by i samples $z^{-j}$=Z-transform of the discretized version of an output delayed by j samples said digital filter is synthesized by replacing each element of said digital signal processing difference equation with an analog component in accordance with the following steps:

replacing each memory element $z^{-i}$ and $z^{-j}$ with a delay unit that delays a presented voltage for a predetermined amount of time;

replacing each sum block $\Sigma$ with an analog power combiner;

replacing each gain block element $L_i$ and $K_j$ with an analog amplifier, a resistor divider network or an attenuator; and replacing each T-junction between each pair of delay units with an analog power splitter.

20. The method of claim 19, wherein each delay unit that delays a presented voltage for a predetermined amount of time is a length of cable or a filter.

21. The method of claim 19, wherein said digital filter manipulates an optical signal that has a sample rate in the range of 1 GHz.

* * * * *